United States Patent [19]
Barlocchi et al.

[11] Patent Number: 5,152,168
[45] Date of Patent: Oct. 6, 1992

[54] QUANTITATIVE ASSESSMENT OF THE GEOMETRICAL DISTORTION SUFFERED BY THE PROFILE OF A SEMICONDUCTOR WAFER

[75] Inventors: Gabriele Barlocchi, Cornaredo; Fabrizio Ghironi, Villafranca Lunigiana, both of Italy

[73] Assignee: SGS-Thomson Microelectronics, s.r.l., Italy

[21] Appl. No.: 631,018

[22] Filed: Dec. 21, 1990

[30] Foreign Application Priority Data

Dec. 22, 1989 [IT] Italy ................. 83652 A/89

[51] Int. Cl.⁵ ............................................. G01N 19/02
[52] U.S. Cl. ...................................................... 73/104
[58] Field of Search .................. 33/551, 553, 554; 73/104, 105

[56] References Cited
U.S. PATENT DOCUMENTS 4,860,229  8/1989  Abbe et al. .......................... 73/104
4,943,719  7/1990  Akamine et al. ...................... 73/105

*Primary Examiner*—Robert Raevis
*Assistant Examiner*—Howard Wisnia
*Attorney, Agent, or Firm*—Pollock, Vande Sande & Priddy

[57] ABSTRACT

A method for the quantitative assessment of the degree of geometrical deformation undergone by a surface profile of a wafer following the formation of a conformal surface layer employs a simple mechanical profilometer, whose stylus is run over a target morphological detail comprising at least two mutually parallel ridges or reliefs which rise above the plane of the surface of the wafer for a height of between 0.1 and 0.5 $\mu$m, and which enclose between them a depression of a width of between 2 and 4 $\mu$m, in order to determine the elevation of the bottom of the valley between the two ridges relative to the plane of the surface of the wafer from which the ridges rise following the formation of one or more similar surface layers. The vertical measurement of the elevation undergone by the bottom of the valley in itself represents a quantitative index of the vertical and horizontal geometrical deformation undergone by the details of the surface profile of the wafer. In order to determine characteristics of automatic alignability by a particular apparatus employing said target details for automatic alignment, it is possible to establish a maximum value for said distortion index, determined as above, above which the automatic alignment capability is lost.

2 Claims, 2 Drawing Sheets

QUANTITATIVE ASSESSMENT OF THE GEOMETRICAL DISTORTION SUFFERED BY THE PROFILE OF A SEMICONDUCTOR WAFER

BACKGROUND OF THE INVENTION

1. Field of the Invention

The present invention relates to a method for quantitatively assessing the degree of deformation undergone by a surface profile of a wafer following the formation of conformal surface layers by means of epitaxial growth, oxidation and/or deposition, during the manufacture of semiconductor devices.

2. Description of the Prior Art

Planar technology is used in the manufacture of semiconductor devices and integrated circuits. It comprises diffusing, in clearly defined areas, the doping agents necessary for the production of the semiconductor junctions. This type of technology requires a succession of photolithographic procedures and perfect alignment of each individual mask relative to the preceding one. In critical working stages, slight inaccuracies, often of cumulative nature, can cause serious production delays in so far as the automatic alignment performed by the production apparatuses with successive masks is compromised. Often, accurate assessment of these problems may not be achieved during the phases of design and manufacture of prototypes, and may instead become apparent on the start-up of mass production, requiring manual intervention for the purposes of alignment whenever the automatic alignment system signals an error status. Means and procedures for studying geometric distortion are somewhat complicated and require a considerable expenditure of time.

OBJECT AND SUMMARY OF THE INVENTION

There is clearly a need for a simple method for quantitatively assessing the degree of distortion undergone by a surface profile of a wafer following the formation of one or more surface layers by epitaxial growth, oxidation and/or deposition during the manufacture of semiconductor devices. It would also be extremely valuable to have an easily applicable pass/fail test to establish whether a particular wafer can still be automatically aligned by a particular process apparatus, which alignment system obviously has defined limits of resolution in respect of certain standardized target morphological details which are normally produced on the wafer during the initial working phases (e.g. before the epitaxial growth).

The method forming the subject of the present invention permits both these objectives to be met in an extremely simple manner with the use of a common stylus-type mechanical profilometer.

Essentially, it has been found that the simple determination of the elevation, relative to the plane of the surface of the wafer, undergone by a depression defined by two mutually parallel ridges or reliefs which rise from the plane of the surface of the wafer over a height of between about 0.1 and 0.5 or more $\mu$m, enclosing said valley having a width of between 2 and 4 $\mu$m, supplies an index which is quantitatively characteristic of the geometrical distortion undergone by the details of the surface profile of the wafer, both in terms of vertical distortion and in terms of horizontal distortion.

The standardized morphological details of an automatic alignment target, which are formed on the surface of the wafer in the initial phases of the manufacturing process, often comprise such a morphological conformation, formed by two parallel reliefs or ridges, originally having a substantially rectangular cross-section with a height of between 0.1 and 0.5 $\mu$m separated by a distance of between about 2 and 4 $\mu$m and said separating depression between the two parallel reliefs represents an ideal morphological detail for measuring the degree of geometrical deformation according to the method of the present invention, making use of the particular independence of the experimental reading of the angle of incidence between the direction of scanning of the stylus of the profilometer and the direction of said parallel ridges, as will be shown in due course.

BRIEF DESCRIPTION OF THE DRAWINGS

The various aspects and advantages of the invention will be more easily understood from the description which follows and which also contains a number of examples, and with reference to the attached drawings, in which.

DESCRIPTION OF THE PREFERRED EMBODIMENT

Figure 1:
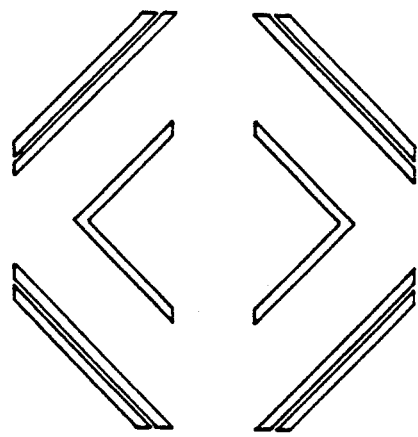
FIG. 1 is a plan view of a target detail.

With reference to the figures, a typical alignment target used in well known apparatuses from Perkin Elmer is shown in FIG. 1 and, as is known in the relevant art, at least two of such target details are formed on the surface of a wafer, in two diametrally opposed positions thereof, before proceeding to the growth of the epitaxial layer. Said target details must be clearly defined on the face of the wafer after the epitaxial growth, in a manner such as to be detectable by the optical alignment apparatus, which uses, for the purpose of collimation, half of a first target and half of another target which is present in a diametrally opposed position on the wafer. Naturally, excessive geometrical deformation of one and/or the other of the targets, following the formation of the substantially similar layer (e.g., growth of the epitaxial layer), determines the incapacity of the automatic optical alignment system to perform its function in the correct manner.

As may be observed in FIG. 1, the outermost bands of the target are formed by two parallel reliefs with a width of 15 $\mu$m and mutually separated by a distance of about 3 $\mu$m. This conformation is shown in cross-section in FIG. 2, in which is also shown the outline of the stylus point, having a radius of 5 $\mu$m of a mechanical profilometer normally used for recording roughness. As can be observed in the case of a morphological detail similar to that of the outer bands of the target used in Perkin Elmer apparatuses, a profilometer stylus having a radius of 5 μm is perfectly able to touch the bottom of a depression 3 μm wide existing between the two parallel reliefs 0.2 μm high. In practice, the profilometers are supplied with tables indicating, for each of the stylus point diameters in the kit, the limits of resolution in terms of minimum width and maximum depth of a depression. Said limit is often expressed by a parameter "L" (μm) which is valid for a specific radius of the stylus point R, and which establishes that the point of the stylus is able to touch the bottom of an interspace only if the width of the dip is greater than L for a given maximum depth. This is expressed in graphical terms in FIG. 3.

Figure 2:
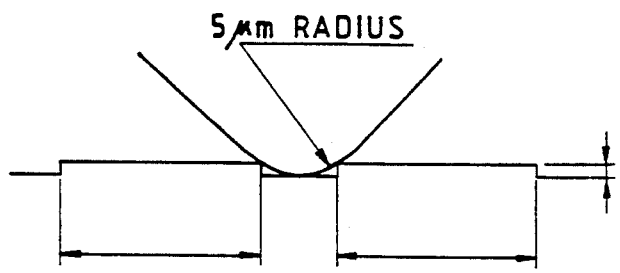
FIG. 2 is a transverse section through one of the outer bands of the target according to FIG. 1.
Figure 4:
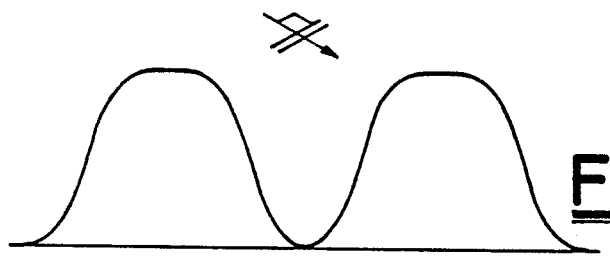
FIGS. 4 and 5 show the effect of a changed angle of scanning of certain morphological details by the profilometer.
Figure 5:
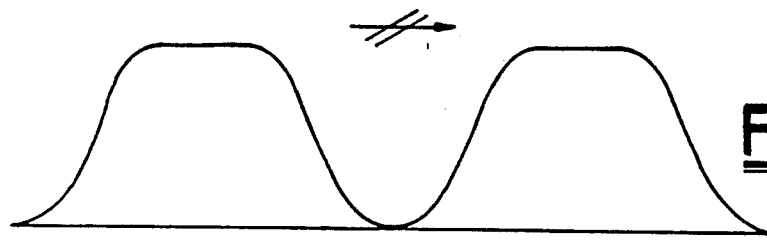

FIG. 4 shows the profile recorded by the profilometer when the stylus is passed over the morphological detail in FIG. 2, in a scanning direction which is perfectly perpendicular to the two parallel reliefs, as indicated by the arrow symbol. FIG. 5 shows the profile recorded by the profilometer when the stylus is run over the morphological detail according to FIG. 2 in a scanning direction inclined at an angle other than 90° relative to the two parallel reliefs. What is important to note is that, by modifying the scanning angle, the profile widens or narrows in the horizontal direction while the dimensions along the vertical axis are retained substantially unchanged.

Figure 6:
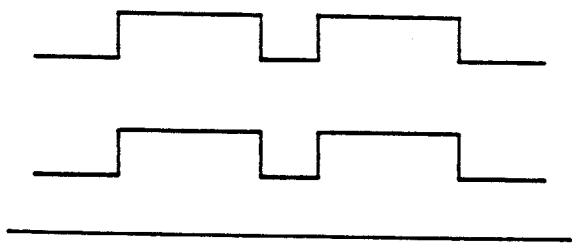
FIG. 6 schematizes the formation of a similar layer, ideally without geometric deformation.
Figure 7:
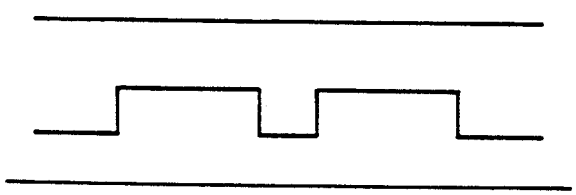
FIG. 7 schematizes the formation of a planarizing layer, that is to say the layer obliterating the previously existing morphological details.

Turning now to consider what happens to morphological details of a profile when a layer is formed on the surface of the object in a more or less conformal manner, it can be seen that, as in FIG. 6, the formation of a perfectly conformal layer, (e.g., epitaxial growth), is such as to produce no deformation of the previously existing surface morphological details, whereas at the opposite extreme, it can be seen that, as in FIG. 7, a layer has grown which has completely obliterated the previously existing morphological details (e.g., a planarizing layer).

Figure 8:
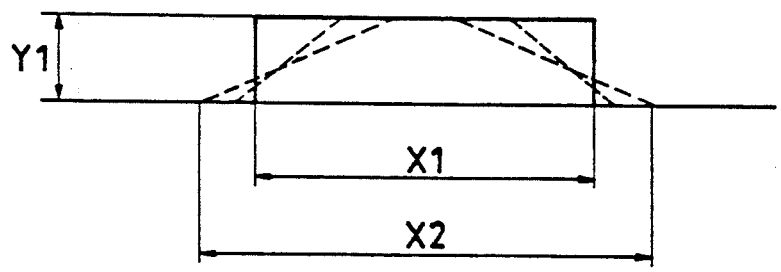
FIG. 8 shows the process of geometrical deformation undergone by a morphological detail represented by an isolated relief of rectangular cross-section.

In practice, in the course of the growth or formation of substantially conformal layers, the previously existing morphological details undergo a certain geometrical deformation, although this is limited. Such a process of geometrical deformation, which may occur with the growth of an epitaxial layer, can be illustrated as in FIG. 8. A morphological detail (for example, a strip in relief), which originally had a rectangular cross-section, undergoes a widening of the base and a narrowing of the apex via a progressive inclination of the sides, which were originally perpendicular to the plane of the surface. Such widening of the base is indicated in FIG. 8 by the dimensions X1 and X2, whereas the height of the relief Y1 remains substantially unchanged. In other words, an originally straight step tends to become increasingly trapezoidal with the increase in thickness of the layer formed on the original surface, and as a function of the real growth conditions.

Figure 9:
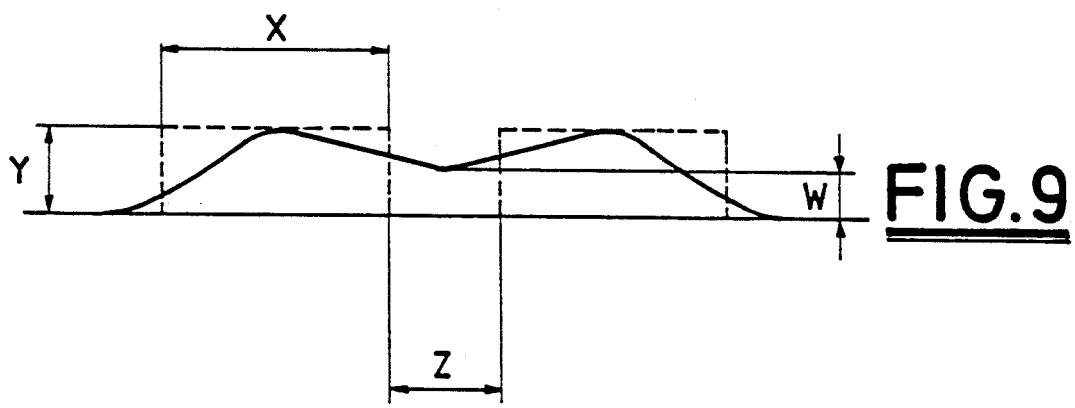
FIG. 9 shows the process of geometrical deformation undergone by a morphological detail comprising two adjacent reliefs.

In the case of two reliefs which are relatively adjacent to each other, this tendency on the part of originally vertical steps to become steps of trapezoidal shape via a widening of the base produces an elevation of the bottom of the depression between the two reliefs relative to the plane of the surface. This is shown diagrammatically in FIG. 9, in which the outlines of the two original reliefs are shown in broken lines whereas the final, distorted profile which is reproduced on the surface of the "conformal" layer formed on the original surface is shown in a solid line. The elevation of the bottom of the depression between the two reliefs is indicated by "W".

Naturally, the contiguity or adjacence of the reliefs must be such that the respective widenings of the base of the previously existing reliefs interfere in the separating interspace between the two reliefs, and the elevation of the bottom of the depression W in the separating interspace between the two reliefs can advantageously be used as an index of "resolvability" between two contiguous reliefs after the formation of the layer. The elevation of the bottom of the separating depression between two contiguous reliefs can be easily and non-destructively measured by means of a stylus-type profilometer, which further has the advantage of substantial insensitivity of the measured result to the scanning angle, as indicated in relation to FIGS. 4 and 5 discussed above.

Figure 3:
FIG. 3 is a diagrammatic section of a morphological detail used to define the limits of resolvability by a given profilometer stylus point.

As has been seen previously, with reference to FIGS. 1, 2 and 3, two parallel ridges or reliefs which rise by a height of about 0.1 to 0.5 μm above the plane of a wafer, and which are mutually separated by a distance of between 2 and 5 μm, as is the case with the outer bands of the target according to FIG. 1, represent a morphological detail which is ideally suited to being tested by means of a profilometer in order to establish, by measurement of the elevation of the bottom of the depression of the separating interspace between the two parallel reliefs, whether or not a specific degree of "resolvability" has been maintained, or whether geometrical distortion has occurred.

A simple calibration procedure will therefore make it possible, taking into account the particular characteristics of the limits of alignability of a wafer by a specific automatic alignment apparatus, to establish a maximum limit value for the elevation (or index) of the bottom of the depression which can be recorded by means of testing with the profilometer, beyond which the specific automatic alignment apparatus is destined to lose its alignment capability. An easily applicable profilometer test of the wafers after the epitaxial growth process can therefore represent a reliable test of the pass/fail type of the wafers before the latter are fed to the automatic alignment apparatus for the subsequent masking operation required by the manufacturing process. The profilometer test according to the method of the present invention thus represents an advantageous method of quantitative assessment of the geometrical distortion undergone by a surface profile of a wafer following the formation of a conformal layer on the surface thereof.

As regards checking the alignability of a wafer by a particular automatic alignment apparatus, it should be noted that such apparatuses commonly employ at least two targets, expediently positioned in two diametrally opposed positions on the face of each wafer. The profilometer test to determine the alignability of the wafer will be carried out on both alignment targets, and any disparity between the two values of the elevation of the bottom of the depression (indices) measured by the profilometer represents a valid index of uniformity of conditions of formation of the conformal layer relative to the dimensional extension of the wafer. Non-uniformity between one side and the opposite side of a wafer can, in fact, result from process temperature differences at the two points due to a stratification of the temperature within the deposition chamber, or to other reasons.

EXAMPLE

To verify the validity of the method according to the invention, a mechanical profilometer of the ALPHA STEP 100 type was used, a stylus tip having a diameter of 5 μm and a stylus weight of 4 mg being employed.

The test zones used in all the experiments were two alignment targets of the type employed by Perkin Elmer alignment apparatuses of the type illustrated in FIGS. 1 and 2, and the profilometric recordings used in the experiments were the recordings relative to the passage of the point of the stylus across an outer double band of the target, which was preferably traversed in a scanning direction virtually orthogonal to said band.

The tests were carried out on a certain number of slices or wafers of monocrystalline silicon, on the surface of which an epitaxial layer was grown by procedures which differed both in terms of the precursor compound used, which in the series of experiments was silicon tetrachloride (SiCl4) or trichlorosilane (SiHCl3), and in terms of growth conditions: low pressure (LP) and/or atmospheric pressure (ATM), temperature and uniformity of temperature along the extent of the slices or wafers.

The alignment targets on each slice were two, specifically one located in the vicinity of the flat side of the slice and the other positioned in a position diametrally opposed to the first.

After epitaxial growth had taken place, the profilometer was used to establish a measurement of the elevation of the bottom of the depression of the separating interspace between the two parallel reliefs of the alignment target (which originally had the cross-section shown in FIG. 2). Such measurements or indices, expressed in Angstroms, were recorded on both the targets present in the two abovementioned positions on the face of the wafer.

The results of these measurements are recorded in the appropriate columns of Table 1.

The same wafers which were tested on the profilometer were then fed to a Perkin Elmer alignment apparatus, and the relative signal of alignment validity (valley/peak signal) is also recorded in the appropriate column of Table 1.

The series of experiments made it possible to establish that, for the particular automatic alignment apparatus and the respective alignment target, the alignability of a wafer becomes critical when the bottom of the valley of the separating interspace between the two reliefs of the target detail is elevated by about 300 Angstroms (0.03 μm). Beyond this maximum elevation value there is a substantial loss of aligning capability on the part of the automatic alignment apparatus.

By means of a simple calibration procedure for a given automatic alignment apparatus, it is therefore easy to establish both a maximum limit of elevation which is acceptable for a verification of the pass/fail type of the wafers before they are fed to the alignment apparatus for the subsequent masking operation, and to establish a scale of evaluation which is suitable for one's own specific purposes. A possible scale of evaluation is recorded in the appropriate column of Table 1.

The verification of the elevation undergone by the bottom of the depression between the two contiguous reliefs of a target detail, and the uniformity of said elevation on targets appropriately positioned at diametrally opposed points on the slice, further permits a quantitative assessment of the geometrical distortion undergone by a surface profile of a wafer.

TABLE 1

| Type of growth of an epitaxial layer | | Profilometer index of elevation of the valley bottom in Å. | | Signal of valley/peak ratio | Evaluation |
| --- | --- | --- | --- | --- | --- |
| Precursor Compound | Growth Conditions | flat side of the wafer | side opposite flat side | by the alignment apparatus | of alignability |
| SiCl4 | LP + ATM | 300 | 350 | 0.90 | critical |
| SiCl4 | LP + LP | 50 | 60 | 0.72 | good |
| SiHCl3 | ATM + ATM | 1000 | 600 | non-alignable | |
| SiHCl3 | LP + LP | 0 | 0 | 0.65 | ideal |

It is apparent that, although for convenience, use was made of the Perkin Elmer type of target detail, the method according to the present invention can perfectly well be applied with the use of other types of targets which nevertheless possess a configuration determined by two reliefs, preferably of rectangular cross-section, which are mutually parallel and have a height of a fraction of a micrometer and a separation distance of between approximately 2 and 4 μm. The lower limit for the separation distance being determined by the capability of the point of the stylus of the profilometer to touch the bottom of the depression, while the upper limit is linked to the other necessary condition, that is to say the widening at the base of the original profile of the two contiguous parallel reliefs "interfering" in the separating interspace in a manner such as to cause an elevation of the bottom of the depression relative to the level of the plane of the surface. Naturally, both these limits are to some extent dependent on the original height of the parallel reliefs, and on the diameter of the point of the stylus of the profilometer and they may consequently also be slightly different from the two limit values indicated.

What we claim is:

1. A method for quantitatively assessing the degree of geometrical deformation of a surface profile of a wafer having formed thereon a surface layer during the manufacture of semiconductor devices and providing a numberical index of geometrical distortion and alignability of the wafer comprising:

providing on said wafer at least two alignment targets, each of which comprises standard morphological details prior to forming a layer on said wafer, each alignment target including at least two mutually parallel reliefs which extend above the plane of the wafer surface, enclosing a depression;

scanning one of said alignment targets with a stylus-type mechanical profilometer in a scanning direction substantially perpendicular to said parallel reliefs following the formation of said layer on said wafer;

determining from said scanning the elevation of the depression relative to the plane of the surface of the wafer which results when said layer is formed on said wafer; and, producing a quantitative index of the geometrical deformation in the vertical and horizontal directions undergone by at least part of the wafer surface profile, said quantitative index having a value for indicating when a substantial loss in alignability of the wafer an optical alignment process occurs.

2. The method as claimed in claim 1, wherein said parallel reliefs originally have a substantially rectangular cross-section, a height of between 0.1 and 0.5 micrometers, and are separated by a distance of between 2 and 4 micrometers.

* * * * *